Figure 1:
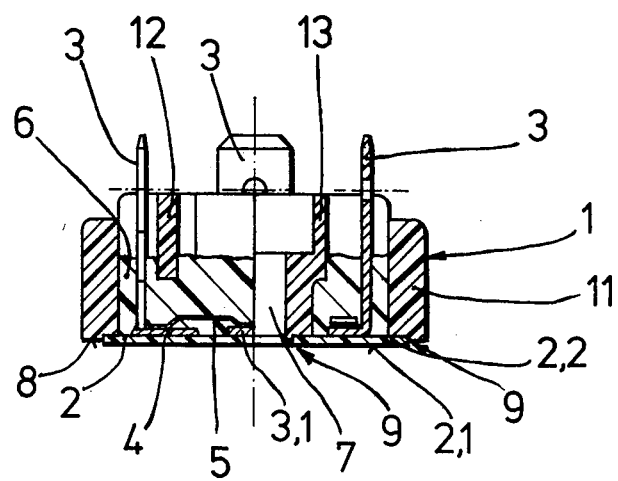

United States Patent [19]

Rief et al.

[11] 4,436,951
[45] Mar. 13, 1984

[54] SEMICONDUCTOR POWER MODULE

[75] Inventors: Rolf Rief, Mannheim; Peter Wetzel, Weinheim-Lützelsachsen, both of Fed. Rep. of Germany

[73] Assignee: Brown, Boveri & Cie AG, Mannheim, Fed. Rep. of Germany

[21] Appl. No.: 284,335

[22] Filed: Jul. 17, 1981

[30] Foreign Application Priority Data

Jul. 25, 1980 [DE] Fed. Rep. of Germany ....... 3028178

[51] Int. Cl.³ .............................................. H05K 5/00
[52] U.S. Cl. ................................ 174/52 PE; 361/388
[58] Field of Search .......... 174/52 FP, 52 PE, 16 HS; 357/81; 361/388

[56] References Cited

U.S. PATENT DOCUMENTS 3,801,728  4/1974  Gallo et al. ............... 361/288 X
4,218,724  8/1980  Kaufman .................... 361/395

Primary Examiner—G. P. Tolin
Assistant Examiner—D. A. Tone
Attorney, Agent, or Firm—Herbert L. Lerner; Laurence A. Greenberg

[57] ABSTRACT

Semiconductor power module, including a substantially prismatic plastic housing with a lower surface having a recess with a shoulder-like step formed in the periphery thereof, a ceramic plate being inserted into the step and having an outer flat surface extending beyond the lower surface of the housing and an inner flat surface facing the interior of the housing, metallizations, semiconductor components and solder jumpers disposed on the inner surface of the ceramic plate, external contact elements being disposed on the inner surface of the ceramic plate and being freely accessible from on top of the housing, the housing including a frame having an open top and bottom, a central fastening part having a lower surface and having a hole formed therethrough for fastening the module to a heat sink, and radially-directed spokes extended between the frame and the central fastening part, the ceramic plate being braced against the lower surface of the central fastening part and having a breakthrough formed therein in alignment with the through hole, the spokes being disposed at a distance from the ceramic plate defining a space therebetween, and each of the external contact elements being separated from each other by at least one spoke, and hardened insulating casting compound filling substantially half of the interior of the housing.

10 Claims, 2 Drawing Figures

SEMICONDUCTOR POWER MODULE

The invention relates to a semiconductor power module with an approximately prismatic plastic housing, a recess formed in the lower surface of the housing, a ceramic plate which is inserted into a shoulder-shaped step at the periphery of the recess in such a manner that one of its flat surfaces protrudes slightly over the bottom surface of the housing, with metallizations, semiconductor components and solder jumpers on the other surface of the ceramic plate facing the interior of the housing, contact elements which are freely accessible from the top of the housing, devices for mounting the module to a heat sink, and a hardened insulating compound in the interior of the housing.

Such a module is known from German Published, Non-Prosecuted Application DE-OS No. 28 40 514. The known module has an approximately prismatic housing without a bottom. In the top of the housing there are a number of openings which are constructed and arranged in such a way that the external contact elements, wires or flat plugs, which allow the electrical connection to the semiconductor components assembled in the interior of the housing, to pass and thus be accessible from the top of the module. A hardenable plastic compound can be injected through a further opening in the insulating housing. The module is fastened to a heat sink by means of flanges which are integrally provided laterally at the housing, with a hole in each. The ceramic plate which carries the semiconductor components, metallization and the external contact elements, is inserted into the opening of the housing on the lower side in such a manner that it protrudes slightly, i.e. 0.025 mm, over the bottom surface of the housing. This is supposed to provide particularly good contact between the ceramic plate and the heat sink.

Experience with this module, which is also commercially available, has shown however that quite a number of shortcomings exist. Thus, it is particularly found that the contact pressure between the ceramic plate and the heat sink is not high enough since the protrusion of the ceramic plate over the bottom surface of the housing is too little and the mounting flanges formed of plastic can transmit only a little contact pressure. The use of a special foil between the ceramic plate and the heat sink as proposed in the above-mentioned patent application for eliminating this already recognized disadvantage, also however nullifies the intended improvement of the heat transfer between the semiconductor and the heat sink, as well as the desired reduction of the assembly labor. It is also relatively difficult to fill the interior of the housing, which is closed on all sides after the ceramic plate is inserted, with the hardenable plastic compound.

It is accordingly an object of the invention to provide a semiconductor power module which overcomes the hereinafore-mentioned disadvantages of the heretofore-known devices of this general type, and does so in such a way that production is simplified and the assembly is improved, particularly with respect to low heat resistance.

With the foregoing and other objects in view there is provided, in accordance with the invention, a semiconductor power module, comprising a substantially prismatic plastic housing with a lower surface having a recess with a shoulder-like step formed in the periphery thereof, a ceramic plate being inserted into the step and having an outer flat surface extending slightly beyond the lower surface of the housing and an inner flat surface facing the interior of the housing, metallizations, semiconductor components and solder jumpers disposed on the inner surface of the ceramic plate, external contact elements being disposed on the inner surface of the ceramic plate and being freely accessible from on top of the housing, the housing including a frame having an open top and bottom, a central fastening part having a lower surface and having a hole formed therethrough for fastening the module to a heat sink, and radially-directed spokes extended between the frame and the central fastening part, the ceramic plate being additionally braced against the lower surface of the central fastening part and having a breakthrough formed therein in alignment with the through hole, the spokes being disposed at a distance from the ceramic plate defining a space therebetween, and each of the external contact elements being separated from each other by at least one spoke, and hardened insulating casting compound filling substantially half of the interior of the housing.

The advantages which result from this construction are that for mounting the module to a heat sink, only a single central fastening screw is required; that the casting compound can be poured into the housing which is open on top in the very simplest manner; that the casting compound distributes itself in the interior of the housing because of the spacing between the ceramic plate and the spokes; that the pressure produced by the fastening screw is uniformly distributed not only over the central fastening part but also through the spokes and the hardened casting compound with respect to the ceramic plate; that through the separation from each external contact element by one of the spokes, the leakage path between the two contact elements is lengthened; and that due to all of these measures, very good heat transfer from the semiconductors to the heat sinks is obtained.

In accordance with another feature of the invention, the housing and ceramic plate are tightly cemented to each other. This provides the possibility of also using extremely liquid casting compounds without casting compound becoming lost through a possible gap between the housing and the ceramic plate. Advantageously, not only does the frame have a shoulder-shaped step in a known manner, into which the ceramic plate is inserted, but in accordance with a further feature of the invention, the central fastening part has a shoulder-like step formed therein being continuous with the step formed in the housing. This shoulder-like step centers the ceramic plate and increases the cementing surface.

In accordance with again another feature of the invention, the hole formed in the central fastening part has a larger diameter at the top than at the bottom of the housing. This brings about the ability of the central fastening screw to be recessed and thereby the leakage paths between the external contact elements and the central fastening screws to be extended.

The leakage paths can also be additionally lengthened, in accordance with again a further feature of the invention, by providing that the spokes and central fastening part extend toward the top of the housing beyond the height of the frame.

In accordance with again an added feature of the invention, the outer surface of the ceramic plate extends substantially 250 μm beyond the lower surface of the housing.

This large amount of protrusion makes it possible to manufacture the shoulder-like step into which the ceramic plate is inserted, with a greater tolerance, without impeding direct contact between the ceramic and the heat sink and thereby degrading the good heat transfer.

In accordance with again an additional feature of the invention, there are provided markings disposed on the housing, for determining the position of the module. Such markings customarily serve to indicate the polarity of the contact elements and to ensure the later assembly of the module to the heat sink in the proper position.

In accordance with yet another feature of the invention, the external contact elements are flat plugs.

In accordance with yet a further feature of the invention, the flat plugs have different widths. Thus it is possible for instance to make the flat plugs, through which the control signal for a control semiconductor component is fed, narrower than the contacts carrying the heavy current.

In accordance with a concomitant feature of the invention, the external contact elements are rigid or flexible wires, particularly if the module is intended for assembly in printed circuit.

Other features which are considered as characteristic for the invention are set forth in the appended claims.

Although the invention is illustrated and described herein as embodied in a semiconductor power module, it is nevertheless not intended to be limited to the details shown, since various modifications and structural changes may be made therein without departing from the spirit of the invention and within the scope and range of equivalents of the claims.

Figure 2:
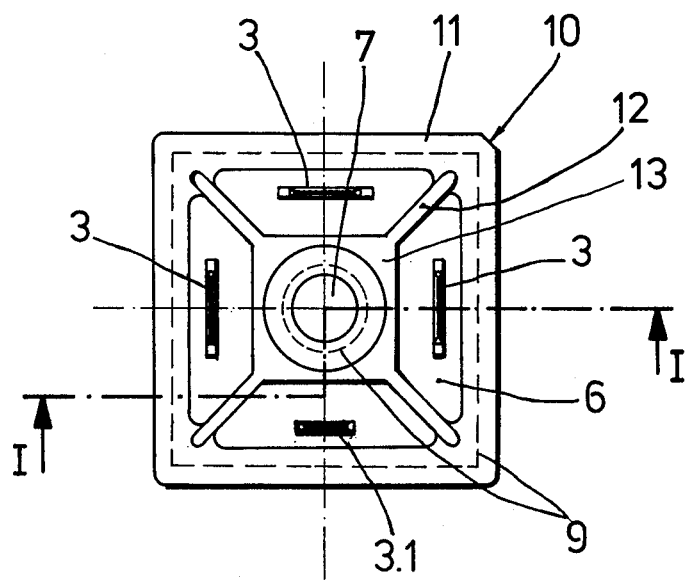

The construction and method of operation of the invention, however, together with additional objects and advantages thereof will be best understood from the following description of specific embodiments when read in connection with the accompanying drawings, in which:

FIG. 1 is a diagrammatic cross-sectional view, partially broken away, of a semiconductor power module, taken along the line I—I of FIG. 2 in the direction of the arrows; and FIG. 2 is a top plan view of the module of FIG. 1.

Referring now to FIGS. 1 and 2 of the drawing as a whole, there is seen a housing 1 of plastic material, such as a fibre-reinforced epoxy resin. The housing includes a frame 11 which is open at the top and bottom, a central fastening part 13, as well as radial ribs 12 between the frame 11 and the central fastening part 13. A shoulder-like step 9 is worked into the bottom surface 8 of the frame 11 and the central fastening part 13. A ceramic plate 2 is inserted into this step 9 and cemented tightly to the housing. The outer surface 2.1 of the ceramic plate 2 protrudes approximately 250 μm beyond the bottom surface 8 of the housing 1. The surface 2.2 of the ceramic plate facing the interior of the housing, has external contact elements 3, 3.1 which are constructed in the embodiment as flat plugs, as well as semiconductor components 4 and jumpers 5, that are fastened by means of non-illustrated metallizations. The contact elements 3, 3.1 are freely accessible from the top of the housing 1. The ribs 12 are disposed in such a way that they separate the contact elements 3, 3.1 from each other, and increase the leakage paths. To this end, the ribs 12 as well as the upper end of the central fastening part 13 are drawn up beyond the height of the frame 11.

It is seen in FIG. 1 that a space remains between the ceramic plate 2 and the lower end of the ribs 12, so that a casting compound 6 can distribute itself uniformly in the interior of the housing 1. After the casting compound 6 has set, the frame 11, the ribs 12, the central fastening part 13, the casting compound 6 and the ceramic plate 2 form a rigid mechanical unit. In this way, the pressure produced by a central fastening screw which is placed through the hole 7 and is bolted to a non-illustrated heat sink, is distributed uniformly over the entire surface 2.1 of the ceramic plate 2, so that a contact pressure that is uniform over the entire surface is obtained.

In FIG. 2 there is additionally seen a marking 10 on the side of the housing 1, with the aid of which the position of the module can be unequivocally determined. It is further seen that the contact element 3.1 has less width than the other three contact elements 3. In this manner, for instance, the contact elements to which the control signals for controllable semiconductor components are applied, can be unequivocally marked.

It is readily seen that the principle according to the invention can be applied not only to the embodiment example of a rectifier bridge shown in the drawing with four uncontrolled diodes, but also to three-phase bridges with six diodes or in so-called rectifier branch pairs with two thyristors or with one thyristor and a diode, etc. In all cases, considerable technical advantages are offered by the fact that even after the ceramic plate is inserted, the interior of the housing and the electrical component contained therein are freely accessible. Such accessibility is furthermore provided without causing degradation of the mechanical stiffness or the electrical reliability, and good uniform contact pressure between the ceramic and the heat sink is obtainable.

There is claimed:

1. Semiconductor power module, comprising a substantially prismatic plastic housing with a lower surface having a recess with a shoulder-like step formed in the periphery thereof, a ceramic plate being inserted into said step and having an outer flat surface extending beyond said lower surface of said housing and an inner flat surface facing the interior of said housing, metallizations, semiconductor components and solder jumpers disposed on said inner surface of said ceramic plate, external contact elements being disposed on said inner surface of said ceramic plate and being freely accessible from on top of said housing, said housing including a frame having an open top and bottom, a central fastening part having a lower surface and having a hole formed therethrough for fastening the module to a heat sink, and radially-directed spokes extended between said frame and said central fastening part, said ceramic plate being braced against said lower surface of said central fastening part and having a breakthrough formed therein in alignment with said through hole, said spokes being disposed at a distance from said ceramic plate defining a space therebetween, and each of said external contact elements being separated from each other by at least one spoke, and hardened insulating casting compound filling substantially half of the interior of said housing.

2. Semiconductor power module according to claim 1, wherein said housing and ceramic plate are tightly cemented to each other.

3. Semiconductor power module according to claim 1, wherein said central fastening part has a shoulder-like step formed therein being continuous with said step formed in said housing.

4. Semiconductor power module according to claim 1, wherein said hole formed in said central fastening part has a larger diameter at the top than at the bottom of said housing.

5. Semiconductor power module according to claim 1, wherein said spokes and central fastening part extend toward the top of said housing beyond the height of said frame.

6. Semiconductor power module according to claim 1, wherein said outer surface of said ceramic plate extends substantially 250 μm beyond said lower surface of said housing.

7. Semiconductor power module according to claim 1, including markings disposed on said housing, for determining the position of the module.

8. Semiconductor power module according to claim 1, wherein said external contact elements are flat plugs.

9. Semiconductor power module according to claim 8, wherein said flat plugs have different widths.

10. Semiconductor power module according to claim 1, wherein said external contact elements are wires.

* * * * *